(12) United States Patent
Morris et al.

(10) Patent No.: US 8,489,555 B2
(45) Date of Patent: Jul. 16, 2013

(54) METHOD OF MANAGING STORAGE AND RETRIEVAL OF DATA OBJECTS

(75) Inventors: John Mark Morris, San Diego, CA (US); Criselda Carrillo, San Diego, CA (US); P. Keith Muller, San Diego, CA (US)

(73) Assignee: Teradata US, Inc., Dayton, OH (US)

( * ) Notice: Subject to any disclaimer, the term of this patent is extended or adjusted under 35 U.S.C. 154(b) by 0 days.

(21) Appl. No.: 13/151,336

(22) Filed: Jun. 2, 2011

(65) Prior Publication Data

US 2011/0231377 A1  Sep. 22, 2011

Related U.S. Application Data

(63) Continuation of application No. 11/533,102, filed on Sep. 19, 2006, now Pat. No. 7,979,394.

(51) Int. Cl.
*G06F 17/30* (2006.01)
*G06F 17/00* (2006.01)

(52) U.S. Cl.
USPC .......................... 707/661; 709/247; 711/171

(58) Field of Classification Search
USPC ................ 707/640, 661; 709/247; 711/171
See application file for complete search history.

(56) References Cited

U.S. PATENT DOCUMENTS 7,451,237 B2 * 11/2008 Takekawa et al. ............ 709/247
7,451,290 B2 * 11/2008 Chandrasekaran et al. .. 711/171

* cited by examiner

*Primary Examiner* — Yicun Wu
(74) *Attorney, Agent, or Firm* — Ramin Mahboubian

(57) ABSTRACT

A technique for managing storage of a data object in a storage device involves receiving the data object (A) to store in the storage device, where the data object has an indicator bit pattern (P). Successive compression data transformations are applied to data object A to obtain respective corresponding compressed data objects, and one of these compressed data objects is selected, such that the selected compressed data object (C) has the shortest length with respect to the remaining compressed data objects. Compression information (I) is then associated with the compression data transformation used to generate data object C, and a threshold value T is calculated at least partly from the length of compression information I. If length (C)+T.gtoreq.length (A), then the indicator bit pattern of data object A is reset and the data object A is written to the storage device. If length (C)+T<length (A), then the indicator bit pattern of data object C is set, compression information I is incorporated into data object C, and data object C is written to the storage device.

42 Claims, 7 Drawing Sheets

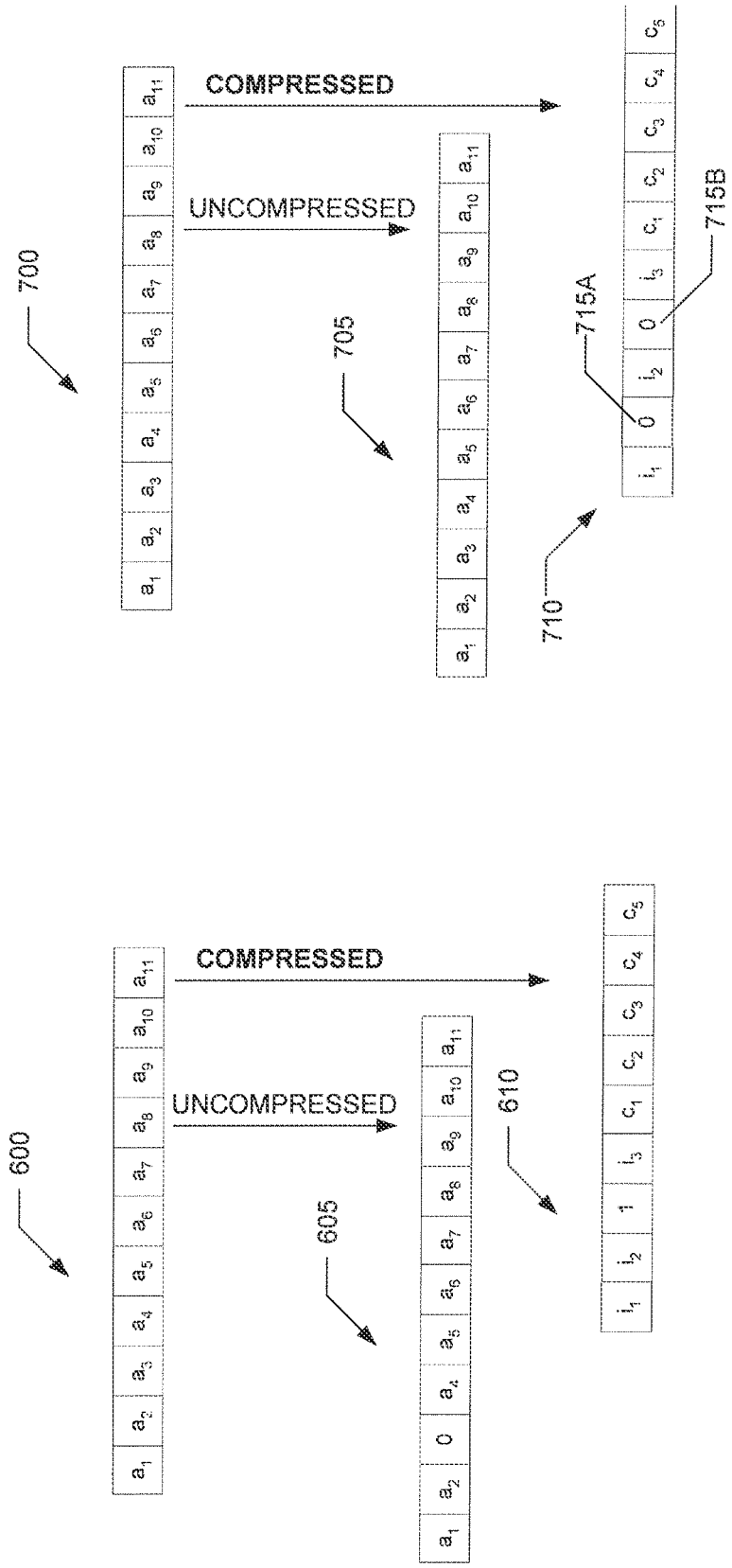

METHOD OF MANAGING STORAGE AND RETRIEVAL OF DATA OBJECTS

CROSS-REFERENCE TO RELATED APPLICATIONS

This application is a Continuation of the U.S. patent application Ser. No. 11/533,102, filed Sep. 19, 2006, now U.S. Pat. No. 7,979,394 entitled "METHOD OF MANAGING STORAGE AND RETRIEVAL OF DATA OBJECTS," which is hereby incorporated herein by reference in its entirety and for all purposes.

BACKGROUND

Computer systems generally include one or more processors interfaced to a temporary data storage device such as a memory device and one or more persistent data storage devices such as disk drives. Each disk drive generally has an associated disk controller. Data is transferred from the disk drives to the disk controller and is then transferred to the memory device over a communications bus or similar. In many computer applications, the speed at which data can be accessed on the disk drives is a limiter to performance.

Data compression has the capability to reduce the size of data and increase the speeds with which data can be written to and read from the disk drives. A sequential access device does not have directly addressable storage and hence it is possible to use compression to both increase performance and reduce the size of the data on media. Since sequential devices are not directly addressable, the compression module is free to redefine the format of data on media and can add compression headers in which to store useful information that will be needed when the data is uncompressed. In this way, compression for sequential access storage is able to be transparent to the application.

It is more difficult to compress data for random access devices in a manner that is transparent to the application. Compression with these systems having addressable storage requires a virtualization layer in the compression module that allows application addresses to be translated to device addresses. The virtualization also permits a compression layer to add useful metadata to the compressed objects. Using this method, a compression module can both produce capacity and increase performance for data transfer.

In certain applications, it is desirable to have a compression module for random access addressable storage that operates without a complex compression module that performs virtual address translation, garbage collection and optimal packing. In some of these applications, it is not necessary to conserve storage capacity but merely to reduce the time to write and/or read data to or from media such as disk drives. An example of a device that would benefit from write time reduction are memory devices that have write data rates orders of magnitude slower than read data rates.

SUMMARY

Described below are methods of managing retrieval of data objects from a storage device and methods of managing storage of data objects in a storage device.

One technique described below involving managing storage of a data object in a storage device first receives the data object (A) to store in the storage device, the data object having an indicator bit pattern (P). Successive compression data transformations or algorithms are applied to data object A to obtain respective corresponding compressed data objects. The compressed data object that has the shortest length with respect to the remaining compressed data objects is then selected and compression information (I) is generated that is associated with the compression data transformation used to generate the selected data object (C). A threshold value T is calculated at least partly from the length of compression information I. If the selected compression data transformation has the effect of reducing the bit size of the data object A by a threshold value T, then an indicator bit pattern of data object C is set to indicate that the object has been compressed, and compression information I is added to the data object C. The data object C is then written to the storage device. Otherwise, if the compression algorithm does not result in the required threshold reduction, then the indicator bit pattern of data object A is reset to indicate that the object has not been compressed and the uncompressed data object A is written to the storage device.

Another technique described below involves managing storage of data objects in a storage device. A data object (A) is received to store in the storage device, the data object having an indicator bit pattern. A data transformation is applied to data object A to generate compressed data object (C). A threshold value T is calculated. If length (C)+T≧length (A), then the indicator bit pattern of data object A is reset and the data object A is written to the storage device. If length (C)+T<length (A), then the indicator bit pattern of data object C is set and the data object C to the storage device.

Another technique described below involves managing storage of a data object in a storage device. The method involves receiving the data object (A) to store in the storage device. Successive compression data transformations are applied to data object A to obtain respective corresponding compressed data objects. One of the compressed data objects is selected, such that the selected compressed data object (C) has the shortest length with respect to the remaining compressed data objects. Compression information (I) is generated associated with the compression data transformation used to generate data object C. A threshold value T is calculated at least partly from the length of compression information I. If length (C)+T≧length (A), then the data object A is written to the storage device. If length (C)+T<length (A), then an indicator bit pattern (P) is incorporated into data object C, compression information I is incorporated into data object C, and data object C is then written to the storage device.

Yet another technique described below involves managing storage of a data object in a storage device. The method involves receiving the data object (A) to store in the storage device. A compression data transformation is applied to data object A to obtain a compressed data object (C). A threshold value T is calculated. If length (C)+T≧length (A), then the data object A is written to the storage device. If length (C)+T<length (A), then an indicator bit pattern (P) is incorporated into data object C and data object C is written to the storage device.

Further techniques described below cover retrieving data objects from a storage device.

Also described are systems and computer programs for managing storage and retrieval of data objects.

BRIEF DESCRIPTION OF THE DRAWINGS

FIG. 6 is a diagram of data objects handled by the technique of FIG. 2.

FIG. 7 is a diagram of data objects handled by the technique of FIG. 3.

DETAILED DESCRIPTION

Figure 1:
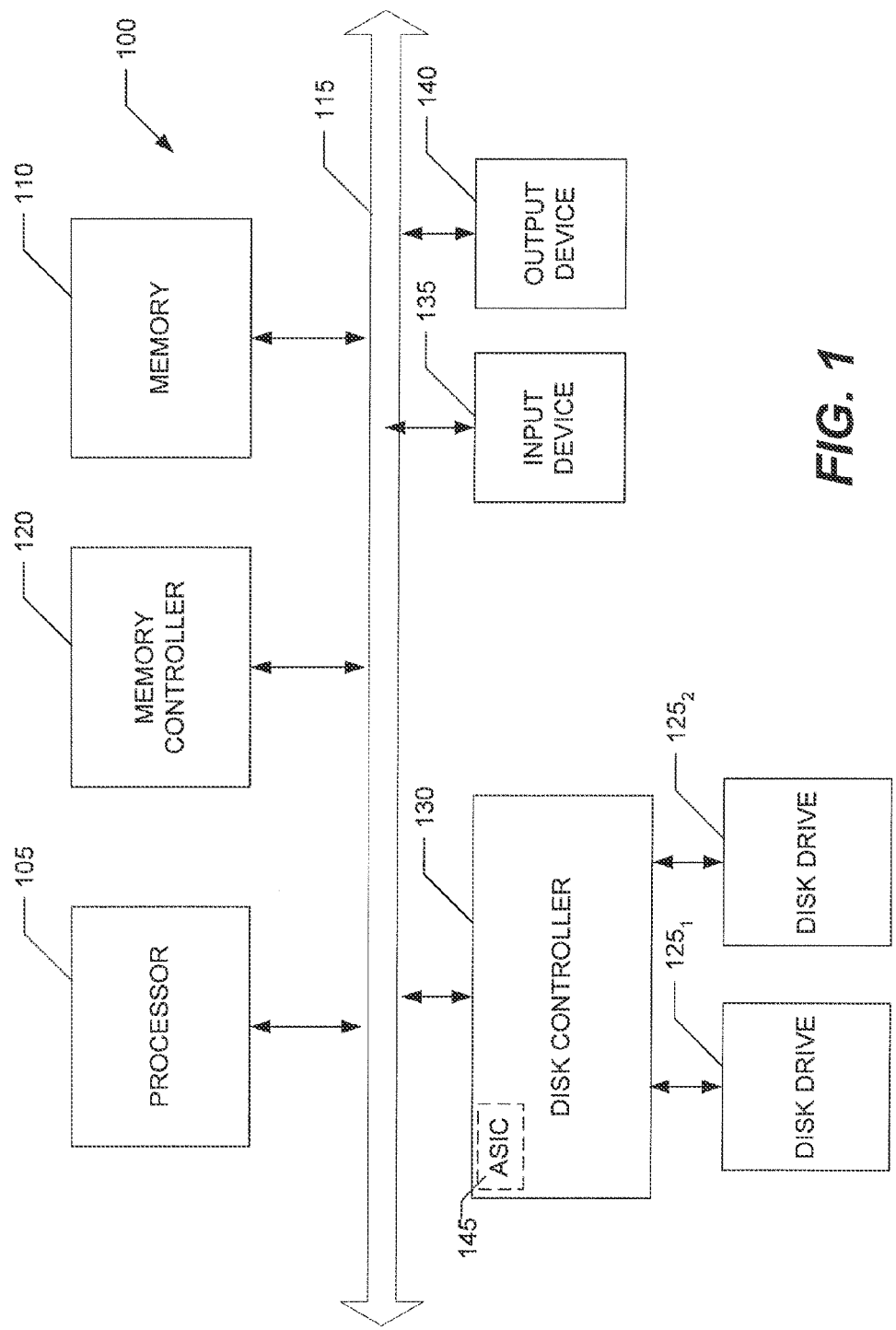
FIG. 1 is a block diagram of a computer system in which the techniques described below are implemented.

FIG. 1 shows a computer system 100 suitable for implementation of a method of managing storage and retrieval of data objects. The system 100 includes one or more processors 105 that receive data and program instructions from a temporary data storage device, such as a memory device 110, over a communications bus 115. A memory controller 120 governs the flow of data into and out of the memory device 110. The system 100 also includes one or more persistent data storage devices, such as disk drives $125_1$ and $125_2$ that store chunks of data or data objects in a manner prescribed by one or more disk controllers 130. One or more input devices 135, such as a mouse and a keyboard, and output devices 140, such as a monitor and a printer, allow the computer system to interact with a human user and with other computers.

The disk controller 130 receives requests from the memory controller 120 to store data objects on the disk drives 125 and to retrieve data objects from the disk drives. Repeated requests for data to be transferred to or from the disk drives has the potential to create a bottleneck between the disk drives 125 and the disk controller(s) 130. Such a bottleneck can affect performance of the computer system 100 due to the delay in transmitting or transferring data objects from the disk drives to the disk controller for subsequent transfer over the communications bus 115.

The techniques described below involve reducing the amount of data that is written to the disk drives 125 by the disk controller 130 and reducing the amount of data retrieved from the disk drives 125 by the disk controller 130. The technique is best implemented in an application-specific integrated circuit (ASIC) 145 that is configured to selectively compress data objects to be written to the disk drives 125 and to uncompress data objects received from the disk drives 125 that have been compressed. In one form, the ASIC 145 is associated with a disk controller 130.

Figure 2:
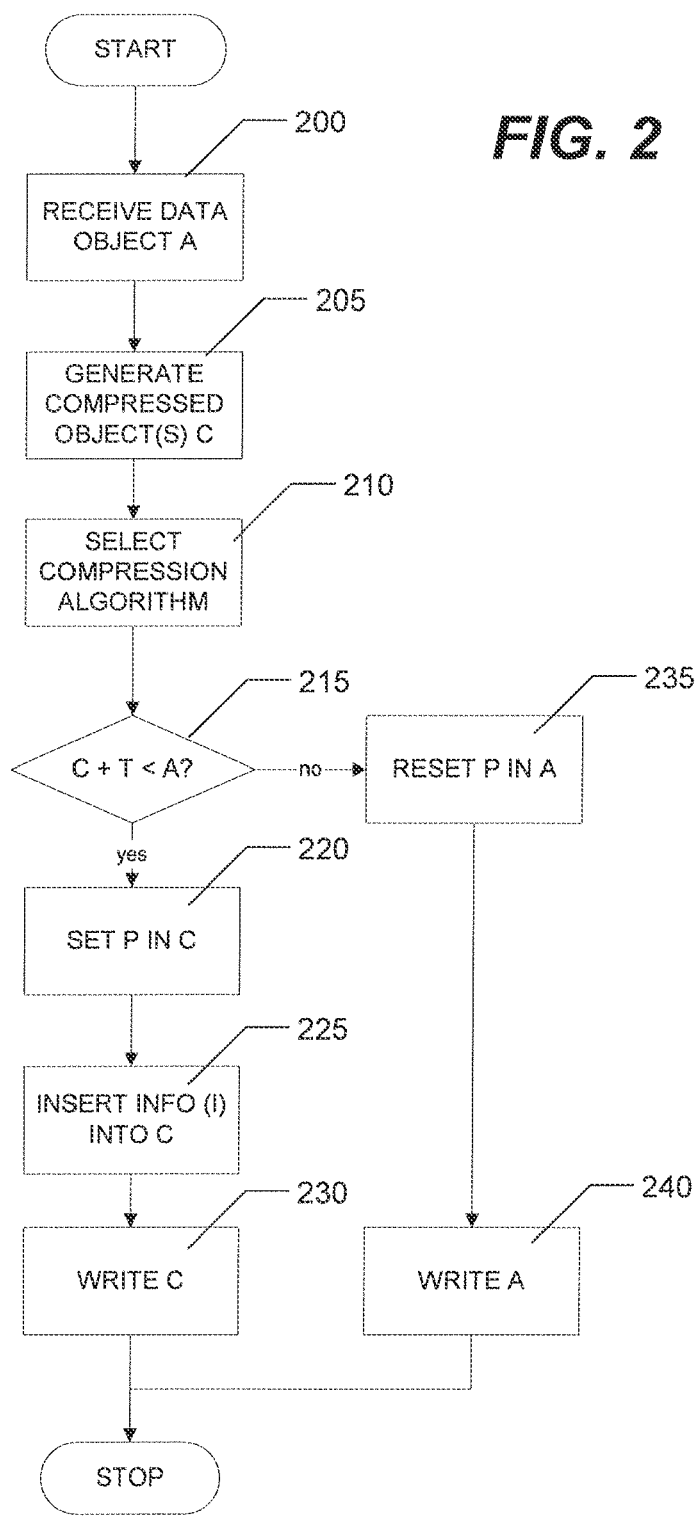
FIG. 2 is a flow chart of one technique for writing a data object to a storage device.

FIG. 2 shows an example of one technique for writing a data object to a storage device with the intention of reducing data traffic between the disk drives and the disk controller. The disk controller 130 first receives an instruction from an application to write a data object to disk drives 125 (step 200). The application that has transmitted the data object to the disk controller dedicates to the compression function a single bit within each data object at a known offset from the start of the data object. This single bit functions as an indicator bit pattern. As will be apparent from the description below, this indicator bit pattern indicates whether or not a data object subsequently retrieved from the disk drives 125 has been compressed.

The ASIC 145 has available to it a plurality of compression data transformations or algorithms. These compression data transformations include Huffman encoding and run length encoding, and any other compression techniques suitable for the data in the data objects. These compression data transformations are applied successively to the data object received by the disk controller (step 205). This process generates a plurality of compressed data objects, each of the data objects generated by a different compression data transformation.

If a compression algorithm is applied to a data set, it is not guaranteed that the compression will reduce the size of the data set. It is possible in some cases for the data set to remain the same size or even to increase in size. One of the generated compressed data objects is selected such that the selected compressed data object has the shortest length with respect to the remaining compressed data objects (step 210). In other words, the data object of shortest length is selected from the store of generated compressed data objects.

The technique in one form generates compression information (I). This compression information represents metadata, one purpose of which is to identify the compression algorithm used to generate the selected compressed data object. This compression information in one form simply consists of a compression data transformation identifier to identify the compression data transformation used to generate the shortest compressed data object. The compression information alternatively also includes a symbol table for use by the compression data transformation and the length in bits of the compressed data object.

Having identified the most effective compression algorithm and generated compression information associated with the compression algorithm, the technique then calculates a threshold value T at least partly from the length of compression information I. In one form of the technique, this threshold value T is the length in bits of the compression information plus 1.

It is desirable to store the compression information with each data object that has been compressed. The compression information I represents an overhead. To be effective, the selected compression algorithm must reduce the size of the data object by an amount such that the length of the compressed object once the threshold value T is added to it remains smaller in size than the original uncompressed data object. If so, the indicator bit pattern of the compressed data object is then set, for example by setting the value of the bit in the indicator bit pattern position to "1" and the data object C is written to the disk drives 125 together with compression information I. Viewing this process another way, the compression information I is incorporated into the data object C and the combined data is written to the disk drives 125. Compression information I in one form is simply concatenated to data object C although the compression information in other forms is inserted in other positions within data object C.

Referring to FIG. 2, the effectiveness of the selected compression algorithm is tested (step 215). If there are sufficient gains in reducing the size of the data object as measured by the test described above, then the indicator pattern in the compressed object is set to indicate that the data object has been compressed (step 220), the compression information I is incorporated into the compressed object (step 225) and the compressed object is written to the disk drives (step 230).

Alternatively, if there is not sufficient advantage in applying the most effective compression algorithm, then the indicator bit in the original data object is then reset or cleared to the value "0" to indicate that the data object has not been compressed (step 235). The uncompressed data object is then written to the disk drives (step 240).

Figure 3:
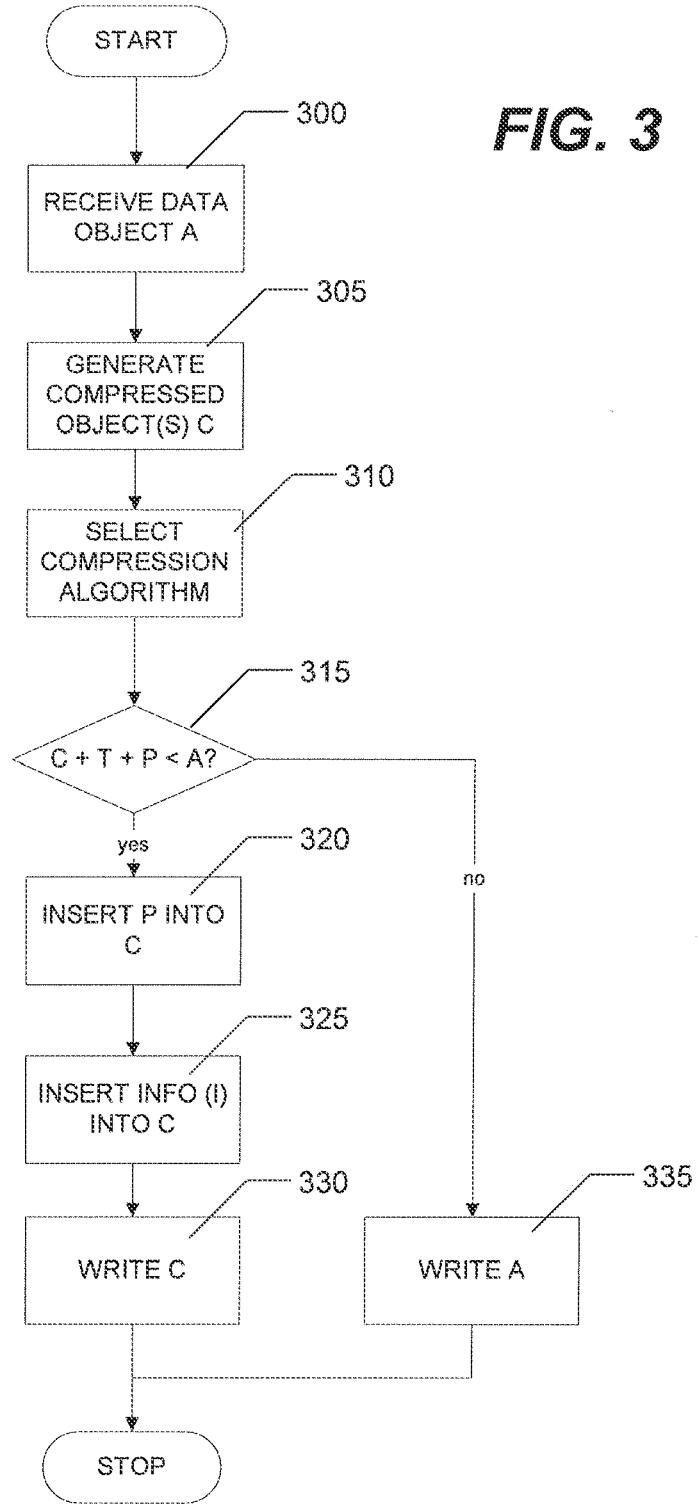
FIG. 3 is a flow chart of another technique for writing a data object to a storage device.

FIG. 3 shows an example of another technique for writing a data object to a storage device with the intention of reducing the data traffic between the disk drives and the disk controller.

The disk controller receives an instruction from an application to write a data object to the disk drives (step 300). The application that has transmitted the data object to the disk controller guarantees that a certain pattern will never occur in a particular set of bits at known offsets within each data object. The set of bits are otherwise usable by the application. This collection of bits functions as an indicator bit pattern. In common with the technique described above with reference to FIG. 2, the indicator bit pattern indicates whether or not a data object subsequently retrieved from the disk drives has been compressed.

As described above, the ASIC has available to it a plurality of compression data transformations or algorithms. These compression data transformations are applied successively to the data object received by the disk controller (step 305). This process generates a plurality of compressed data objects, each of the data objects generated by a different compression data transformation. The technique then selects the most effective compression algorithm by selecting the data object of the shortest length from the store of generated compressed data objects (step 310) as described above.

The technique in one form also generates compression information (I) that identifies the compression data transformation used to generate the shortest compressed data object, a symbol table for use by the compression data transformation, and/or the length in bits of the compressed data object.

Having identified the most effective compression algorithm and generated compression information associated with the compression algorithm, the technique then calculates a threshold T at least partly from the length of compression information I. In one form of the technique, this threshold value will be the sum of the length of the compression information (I) and the length of the indicator bit pattern (P). As described above, it is desirable to store the compression information with each data object that has been compressed. The selected compression algorithm must reduce the size of the data object by an amount such that the length of the compressed object once the threshold number of bits is added to it, remains smaller in size than the original uncompressed data object.

If the sum of the length of the compressed object, the length of the threshold T and the length of the indicator bit pattern P is less than the length of the uncompressed object (step 315), then the indicator bit pattern P is incorporated into the compressed data object (step 320), the compression information I is incorporated into the compressed data object (step 325), and the combined data is written to the disk drives (step 330).

Alternatively, if there is not sufficient advantage in applying the most effective compression algorithm, then the uncompressed data object is written to the disk drives (step 335).

Figure 4:
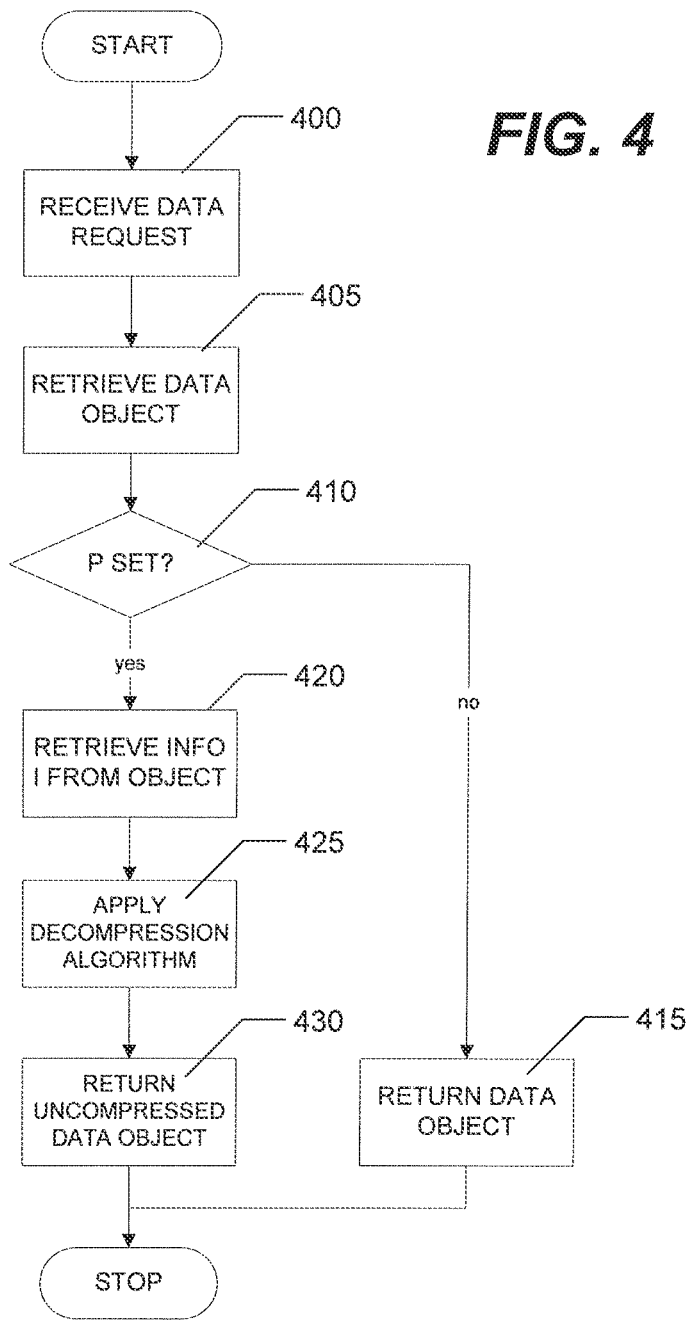
FIG. 4 is a flow chart of one technique for retrieving a data object from a storage device that has been stored by the techniques of FIG. 2 or 3.
Figure 5:
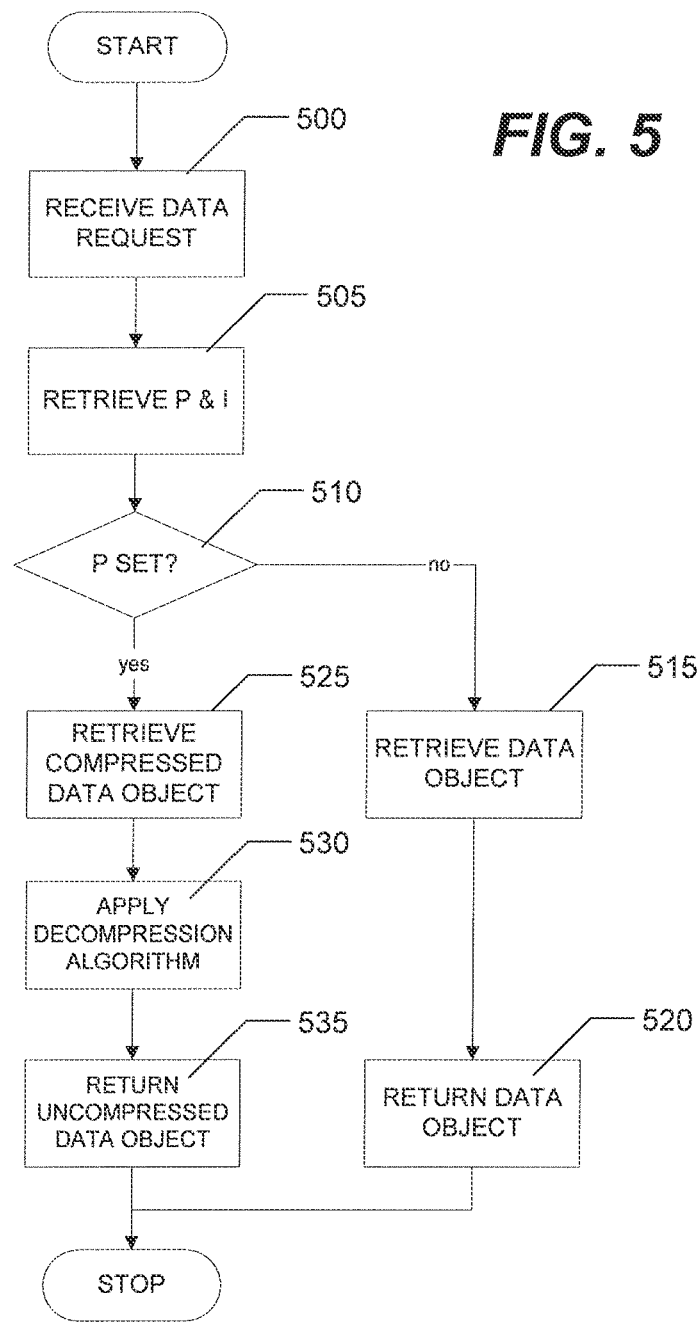
FIG. 5 is a flow chart of another technique for retrieving a data object from a storage device that has been stored by the technique of FIG. 2 or 3.

FIG. 4 and FIG. 5 show examples of techniques for retrieving data objects from a storage device that have been stored by the techniques of FIG. 2 or 3 above. The technique described in FIG. 4 is best suited to systems where it is not efficient to retrieve data objects piece-wise, and FIG. 5 is better suited to systems where there is no additional overhead associated with reading a data object piece-wise.

In FIG. 4 a disk controller first receives an instruction from an application to retrieve a data object from the disk drives (step 400). The entire data object is then retrieved from the disk drives (step 405).

The indicator bit pattern of the retrieved data object is then examined (step 410). If the indicator bit pattern is set, this indicates that the retrieved data object has been compressed and that a decompression algorithm must be applied to the data object. If the data object has been stored using the technique of FIG. 2, this indicator bit pattern will be a single bit at a known offset within the data object. If this single bit has the value "1", then this indicates that the data object has been compressed. Alternatively, if the data object has been stored by the technique of FIG. 3, the value of certain bits within the data object at known offsets will indicate that the data object has been compressed.

If the data object has not been compressed, the retrieved data object is simply returned to the requestor (step 415).

Alternatively, if the data object has been compressed, compression information (I) is obtained or retrieved from the compressed object (step 420). The compression information I specifies the decompression data transformation selected from a set of decompression data transformations to be applied to the data object and any information needed for decompression such as symbol tables. The specified decompression algorithm is applied to the retrieved data object (step 425) and the uncompressed data object is returned to the requestor (step 430).

In FIG. 5, the technique receives a request to retrieve a data object (step 500). As described above, the technique of FIG. 5 is best suited to devices on which there is no additional overhead associated with reading a data block or data object piece-wise.

The data object is located on the disk drive and the indicator bit pattern and compression information are retrieved from the disk drives (step 505).

The indicator bit pattern of the data object is examined (step 510). If the indicator bit pattern shows that the data object has not been compressed, then the entire data object is retrieved from the disk drives (step 515) and the data object returned to the requestor (step 520).

If the indicator bit pattern shows that the data object has been compressed, the compressed portion of the data object is then retrieved from the disk drives (step 525) the appropriate decompression algorithm is identified from the compression information associated with the data object and the selected decompression algorithm applied to the data object (step 530). Following decompression, the uncompressed data object is then returned to the requestor (step 535).

FIG. 6 shows an example of a data object stored or handled by the technique of FIG. 2.

A data object 600 having bits $a_1$ to $a_{11}$ has the technique of FIG. 2 applied to it. If there is no compression algorithm that reduces the size of the data object by a threshold amount, then the uncompressed data object 605 is written to the disk drives. In this example, bit $a_3$ is the bit allocated by the application to be the indicator bit. Bit $a_3$ of data object 605 is cleared by setting the value to "0".

If an appropriate compression algorithm can be identified, the data object written to the disk drives is data object 610. In this example, the compressed data object is 5 bits in length, consisting of bits $c_1$ to $c_5$. The compression information consisting of bits $i_1$, $i_2$ and $i_3$ are incorporated into the compressed object and the indicator bit pattern at position 3 within the combined data object is "set" by setting the value to "1".

FIG. 7 is a diagram of a data object handled by the technique of FIG. 3 described above.

A data object 700 is received by the application. In this example, bits $a_2$ and $a_4$ are reserved for use as an indicator bit pattern, and the application guarantees that a certain pattern, in this case "0 0", will never occur.

If no appropriate data compression algorithm can be applied, the data object 705 is written to the disk drives.

Alternatively, if an appropriate compression algorithm can be found, this is applied to data object 700 resulting in a compressed data object of length 5 bits, $c_1$ to $c_5$. Compression information bits $i_1$, $i_2$ and $i_3$ are incorporated into the compressed object, as is the indicator bit pattern 715A at position 2 and 715B at position 4 showing that the data object has been compressed. The combined compressed data object 710 is then written to the disk drives.

In further alternative forms of the techniques of FIGS. 2 and 3, the ASIC does not have available to it a plurality of compression data transformations or algorithms. The ASIC simply has one compression data transformation that could be preselected depending on the nature of the data to which the compression technique is to be applied. The single compression data transformation is applied to a received data object. If the compression data transformation reduces the size of the data set by a threshold amount, then the compressed data object is stored in accordance with the techniques of FIG. 2 or 3 above.

Maintaining a single data compression transformation has the potential to avoid the need to store with the data object compression information I and therefore further reduce the data transferred between the disk drives and the disk controller. One purpose of compression information I is to identify the compression data transformation used to generate the shortest compressed data object. Where the ASIC has available to it only a single compression data transformation, then the need to store separate compression information I can be reduced except in cases where the compression data transformation requires a symbol table or other data.

Figure 8:
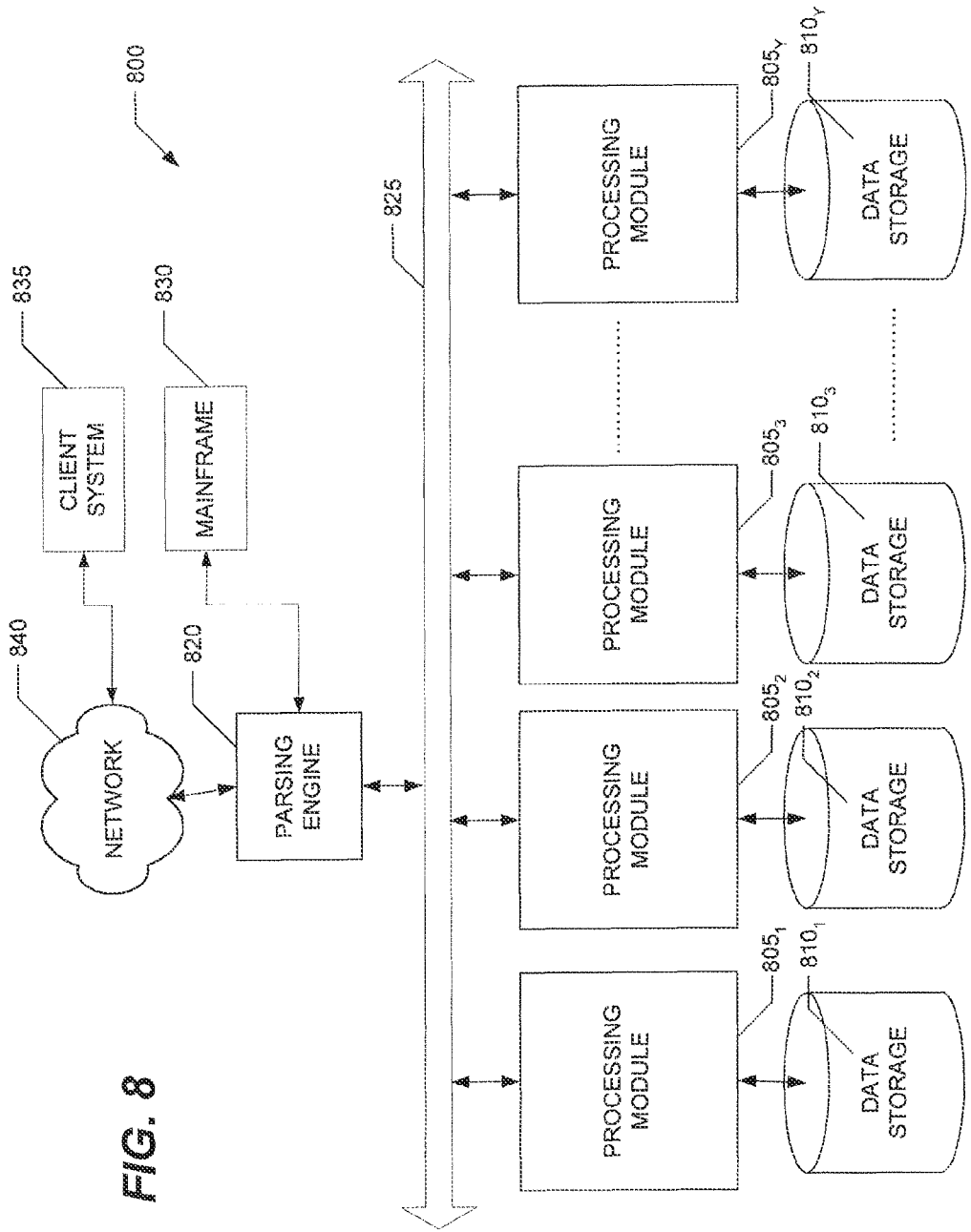
FIG. 8 is a block diagram of an exemplary large computer system in which the techniques described below are implemented.

FIG. 8 shows an example of one type of computer system in which the above techniques of managing storage and retrieval of data objects are implemented. The computer system is a data warehousing system 800, such as a TERADATA data warehousing system sold by NCR Corporation, in which vast amounts of data are stored on many disk-storage facilities that are managed by many processing units. In this example, the data warehouse 800 includes a relationship database management system (RDMS) built upon a massively parallel processing (MPP) platform. Other types of database systems, such as object-relational database management systems (ORDMS) or those built on symmetric multi-processing (SMP) platforms, are also suited for use here.

As shown here, the data warehouse 800 includes one or more processing modules $\mathbf{805}_{1\ldots y}$ that manage the storage and retrieval of data in data storage facilities $\mathbf{810}_{1\ldots y}$. Each of the processing modules $\mathbf{805}_{1\ldots y}$ manages a portion of the database that is stored in a corresponding one of the data storage facilities $\mathbf{810}_{1\ldots y}$. Each of the data storage facilities $\mathbf{810}_{1\ldots y}$ includes one or more disk drives.

A parsing engine 820 organizes the storage of data and the distribution of data objects stored in the disk drives among the processing modules $\mathbf{805}_{1\ldots y}$. The parsing engine 820 also coordinates the retrieval of data from the data storage facilities $\mathbf{810}_{1\ldots y}$ over communications bus 825 in response to queries received from a user at a mainframe 830 or a client computer 835 through a wired or wireless network 840. An application-specific integrated circuit (ASIC) is associated with one or more disk controllers (not shown). The goal of the ASIC is to reduce the amount of data transferred between data storage 810 and the processing modules 805.

The text above describes one or more specific embodiments of a broader invention. The invention also is carried out in a variety of alternative embodiments and thus is not limited to those described here. Those other embodiments are also within the scope of the following claims.

We claim:

1. A method of managing storage of a data object in a storage device, the method comprising:
    obtaining the data object (A) to store in the storage device;
    applying multiple compression data transformations to the data object A to obtain multiple corresponding compressed data objects;
    selecting one of the multiple corresponding compressed data objects, such that the selected compressed data object (C) has the shortest length among the compressed data objects;
    generating compression information (I) associated with the compression data transformation used to generate the selected data object C;
    determining a threshold value T at least partly from the length of compression information I; and
    selecting between and then performing one of the following:
        writing the data object A to the storage device when length (C)+T≧length (A); and
        incorporating the compression information I into data object C and then writing the data object C to the storage device when length (C)+T<length (A).

2. The method of claim 1 further comprising, when length (C)+T<length (A), incorporating an indicator bit pattern (P) into data object C.

3. The method of claim 1 wherein the threshold T is calculated as T=length (I)+length (P).

4. The method of claim 1 wherein the indicator bit pattern comprises a single bit at a known offset within data object C.

5. The method of claim 1 wherein the compression information I includes a compression data transformation identifier to identify the compression data transformation used to generate data object C.

6. The method of claim 1 wherein the compression information I further includes a symbol table associated with the compression data transformation used to generate data object C.

7. The method of claim 1 wherein the compression information I includes the length of data object C.

8. The method of claim 1 wherein the indicator bit pattern P comprises two or more bits at a known offset within data object C.

9. The method of claim 1 wherein the applying of the plurality of the compression data transformations comprises applying at least two of the plurality of the compression data transformations successively.

10. The method of claim 1 wherein the applying of the plurality of the compression data transformations comprises applying at least two of the plurality of the compression data transformations in parallel.

11. The method of claim 1 wherein the applying of the plurality of the compression data transformations comprises applying at least two of the plurality of the compression data transformations in parallel in hardware.

12. The method of claim 11 wherein the at least two compression data transformations performed in parallel in hardware are performed using a plurality of different compression algorithms.

13. A computing system including one or more processors operable to:
    obtain the data object (A) to store in the storage device;
    apply multiple compression data transformations to the data object A to obtain multiple corresponding compressed data objects;
    select one of the multiple corresponding compressed data objects, such that the selected compressed data object (C) has the shortest length among the compressed data objects;

generate compression information (I) associated with the compression data transformation used to generate the selected data object C;

determine a threshold value T at least partly from the length of compression information I; and select between and then perform one of the following:
write the data object A to the storage device when length (C)+T≧length (A); and
incorporate the compression information I into data object C and then write the data object C to the storage device when length (C)+T<length (A).

14. The computing system of claim 13 wherein the one or more processors are further operable to: incorporate an indicator bit pattern (P) into data object C when length (C)+T<length (A).

15. The computing system of claim 13 wherein the threshold T is calculated as T=length (I)+length (P).

16. The computing system of claim 13 wherein the indicator bit pattern comprises a single bit at a known offset within data object C.

17. The computing system of claim 13 wherein the compression information I further includes a compression data transformation identifier to identify the compression data transformation used to generate data object C.

18. The computing system of claim 13 wherein the compression information I includes the length of data object C.

19. The computing system of claim 13 wherein the indicator bit pattern P comprises two or more bits at a known offset within data object.

20. The computing system of claim 13 wherein the applying of the plurality of the compression data transformations comprises applying at least two of the plurality of the compression data transformations successively.

21. The computing system of claim 13 wherein the applying of the plurality of the compression data transformations comprises applying at least two of the plurality of the compression data transformations in parallel.

22. The computing system of claim 13 wherein the applying of the plurality of the compression data transformations comprises applying at least two of the plurality of the compression data transformations in parallel in hardware.

23. The computing system of claim 13 wherein the at least two compression data transformations performed in parallel in hardware are performed using a plurality of different compression algorithm.

24. A method of managing storage of a data object in a storage device, the method comprising:
receiving the data object (A) to store in the storage device;
applying a compression data transformation to data object A to obtain a compressed data object (C);
calculating a threshold value T;
if length (C)+T≧length (A), then writing the data object A to the storage device;
if length (C)+T<length (A), then incorporating an indicator bit pattern (P) into data object C and writing data object C to the storage device.

25. The method of claim 24 wherein the indicator bit pattern P comprises two or more bits at known offsets within data object C.

26. The method of claim 24 wherein the threshold T is calculated as T=length (I)+length (P).

27. The method of claim 24 wherein the indicator bit pattern P comprises a single bit at a known offset within data object C.

28. A device that including one or more processors operable to:
receive a data object (A) to store in a storage device;
apply a compression data transformation to data object A to obtain a compressed data object (C);
calculate a threshold value T;
if length (C)+T≧length (A), then write the data object A to the storage device;
if length (C)+T<length (A), then incorporate an indicator bit pattern (P) into data object C and writing data object C to the storage device.

29. The device of claim 28 wherein the indicator bit pattern P comprises two or more bits at known offsets within data object C.

30. The device of claim 28 wherein the threshold T is calculated as T=length (I) +length (P).

31. The device of claim 28 wherein the indicator bit pattern P comprises a single bit at a known offset within data object C.

32. The device of claim 28 wherein the applying of the compression data transformation to the data object A is performed in hardware.

33. A non-transitory computer readable storage medium storing at least executable code for managing storage of a data object in a storage device, wherein the executable code includes:
executable code for receiving the data object (A) to store in the storage device;
executable code that causes:
applying a compression data transformation to data object A to obtain a compressed data object (C);
calculating a threshold value T;
if length (C)+T≧length (A), then writing the data object A to the storage device;
if length (C)+T <length (A), then incorporating an indicator bit pattern (P) into data object C and writing data object C to the storage device.

34. The non-transitory computer readable storage medium of claim 33 wherein the executable code further includes:
when length (C)+T<length (A), incorporating an indicator bit pattern (P) into data object C.

35. The non-transitory computer readable storage medium of claim 33 wherein the threshold T is calculated as T=length (I)+length (P).

36. The non-transitory computer readable storage medium of claim 33 wherein the indicator bit pattern comprises a single bit at a known offset within data object C.

37. The non-transitory computer readable storage medium of claim 33 wherein the compression information I includes a compression data transformation identifier to identify the compression data transformation used to generate data object C.

38. The non-transitory computer readable storage medium of claim 33 wherein the compression information I includes a compression data transformation identifier to identify the compression data transformation used to generate data object C.

39. The non-transitory computer readable storage medium of claim 33 wherein the compression information I further includes a symbol table associated with the compression data transformation used to generate data object C.

40. The non-transitory computer readable storage medium of claim 33 wherein the applying of the plurality of the compression data transformations comprises applying at least two of the plurality of the compression data transformations successively.

41. The non-transitory computer readable storage medium of claim 33 wherein the applying of the plurality of the compression data transformations comprises applying at least two of the plurality of the compression data transformations in parallel.

42. The non-transitory computer readable storage medium of claim 41 wherein the at least two compression data transformations performed in parallel are performed using a plurality of different compression algorithms.

\* \* \* \* \*